United States Patent [19]
Bulkowski

[11] Patent Number: 4,618,509
[45] Date of Patent: Oct. 21, 1986

[54] ARRAYS OF STACKED METAL COORDINATION COMPOUNDS

[75] Inventor: John E. Bulkowski, Newark, Del.

[73] Assignee: University of Delaware, Newark, Del.

[21] Appl. No.: 614,894

[22] Filed: May 29, 1984

Related U.S. Application Data

[62] Division of Ser. No. 246,648, Mar. 23, 1981, abandoned.

[51] Int. Cl.⁴ .................. C23C 18/00; C23C 28/00; H01L 27/14
[52] U.S. Cl. .................................. 427/74; 427/82; 427/88; 427/430.1
[58] Field of Search ............... 427/74, 82, 430.1, 88

[56] References Cited

U.S. PATENT DOCUMENTS 4,093,757  6/1978  Barraud ........................ 427/434.3
4,199,649  4/1980  Yundt ............................ 427/82

FOREIGN PATENT DOCUMENTS 1572182  7/1980  United Kingdom .

OTHER PUBLICATIONS

Adler, "Solid State Possibilities of Porphyrin Structures" Conference Proceedings of the International Conference on Organic Superconductors, Honolulu, Hawaii, USA, 5-9, Sep. 1969.

*Primary Examiner*—John D. Smith
*Attorney, Agent, or Firm*—Dean R. Rexford

[57] ABSTRACT

A process is disclosed for preparing novel arrays of metal coordination compounds characterized by arrangement of the metal ions, separated by a linking agent, in stacked order one above the other. The process permits great flexibility in the design of the array. For example, layers of different composition can be added to the array at will.

9 Claims, 3 Drawing Figures

○—  Long Chain Fatty Acid
⊥•⊥  Metallo Substituted Metalloporphyrin
—•—  Metalloporphyrin
NⓄN  Pyrazine

ARRAYS OF STACKED METAL COORDINATION COMPOUNDS

The government has rights in this invention pursuant to grant No. DE-FG02-79ER10533 awarded by the U.S. Department of Energy.

This application is a division, of application Ser. No. 246,648, filed Mar. 23, 1981, now abandoned.

BACKGROUND OF THE INVENTION

1. Field of the Invention

This invention is in the field of photosensitive elements which operate by charge separation in a molecular array and transport of electrons and electron holes out of the array. Such elements have use in devices such as photodiodes, photoconductors, and photovoltaic cells for converting incident energy, such as solar energy, to electricity, and to drive electrochemical reactions.

2. Prior Art

In recent years much attention has been given to the development of photosensitive elements, particularly those intended to convert solar energy to electricity. The mechanism of operation of such devices is well understood as outlined, for example, by Butler et al in Journal of Materials Science 15 1-19 (1980). Fundamental to the functioning of such devices is, as is well understood, the radiant energy-induced separation of charges within a molecular or atomic array and charge transport out of the array, for example, to external electrodes or to an electrolyte there to drive an electrochemical reaction, usually a redox reaction.

The literature of photosensitive elements, particularly those employing inorganic materials is voluminous. Recently increasing attention has been given to photosensitive elements employing organic materials such as those of the instant invention. Tang in U.S. Pat. No. 4,164,431, hereby incorporated by reference, provides an excellent review of the state of the art of such elements.

It is generally agreed that efficiency in charge separation and transport out of the array depends on the selection of the materials of the array on the one hand, and on the arrangement of the molecules of the materials within the array on the other.

Materials are selected inter alia so as to provide a so-called spectral match as to wavelength between the absorption properties of the material and the incident radiation. The thickness of the array is selected so as normally to absorb a large fraction of such radiation.

The efficiency of charge transport is generally thought to be a function of the arrangement of the molecules of the array; charge losses probably are associated, at least in part, with disorder. However, from the analogy of inorganic photosensitive elements, it appears that uniform ordering throughout the array does not necessarily lead to the highest possible efficiency; asymmetric arrays may be more efficient at least in some uses.

Unfortunately, known processes for assembling photosensitive arrays such as vapor deposition, crystallization, and electrolytic techniques, give little control over ordering per se. Langmuir-Blodgett films have provided ordered monolayers but the application of ordered successive layers have been without real control as to interlayer orientation. Vincett et al in Thin Solid Films 68 (1980) at p. 163 suggest the incorporation of one or more aliphatic chains into dye molecules as a means to effect desired orientation in certain Langmuir-Blodgett films to produce "organic metals" and high temperature superconductors. At p. 164 the authors suggest that the platinum atoms in complex with phenanthroline may stack to form a linear metallic chain.

As used herein 'element' and 'device' are essentially synonymous. The term 'array' is intended to pertain to a normally ordered Photosensitive assembly of atoms or compounds. An array as here defined forms a part of an element or device. When the term array is applied to invention assemblies, it is intended further to mean an assembly comprising at least two ordered layers of metal coordination compounds, one of which may be a part of the so-called template, as will be explained infra.

SUMMARY OF THE INVENTION

This invention pertains to a novel process for preparing arrays of metal coordination compounds useful in photosensitive elements. The layers of the array are arranged such that the metal atoms are stacked one above the other and are joined by interlayer linkages.

The arrays prepared according to the invention process are novel and are not accessible by any other known process.

The essence of the invention process for preparing such arrays lies in the use of a template, as it will hereinafter be called, and the use of a linking agent. The template comprises a substrate and, deposited thereon, a Langmuir-Blodgett film comprising an ordered monolayer of a metal coordination compound combined with a so-called linking agent which forms interlayer linkages.

The template and the linking agent, by means to be described infra, are capable of causing successive layers of metal coordination compounds making up the array to assume and retain the above mentioned highly ordered stacked structure. The metal coordination compounds comprise at least one metal, usually in the cationic form, and a ligand which coordinates the metal forming a generally planar, "stackable" structure.

In use, either the linking agent or more often the metal coordination compound captures photons, preferably in a practical spectral range. Arrays in which both the metal coordination compound and the linking agent are capable of capturing photons may also be useful and in some cases, may be preferred. Generally, however, the linking agent is transparent to the incident energy, such as solar radiation, but can play a role in matching the spectrum by modifying the absorption properties of the metal coordination compounds. In some cases dye chromophores in the ligand are useful. Metal coordination compound moieties characterized by intervalence charge transfer absorption resulting from the metal-linking agent-metal unit can sometimes be employed for absorption, although the moiety would not normally be regarded as a chromophore.

The ligand of the template monolayer, which may or may not be the same as those of the other layers, is selected or modified, e.g. by substitution, so as to ensure orientation of the substrate in such a way as to expose the metal atom, in the axial direction, to reaction with the linking agent, as will be explained infra.

Successive layers of metal coordination compounds deposited on the template, e.g. from solution, are forced to assume stacked order by means of the linking agent. The linking agent may be, for example, a bifunctional organic compound capable at each of its functional groups of coordinating the metal atom of the metal coordination compound of the template or other layer at its exposed axis. In assembling the array using a bifunctional organic compound, each deposited layer (usually except the last), beginning with the template monolayer, is treated with the linking agent so as to react one of the functional groups, the other group remaining unreacted. When a new layer of metal coordination compound is added, its metal atoms coordinate to the unreacted functional group of the linking agent thus forming a stack in which the metal atoms are stacked one above the other, and the atoms are bonded to each other via the interlayer linkage thus formed.

The invention provides means for preparing highly ordered arrays, which are expected to have substantially improved properties over those of disordered arrays, particularly as to efficiency of charge separation and transport with minimum loss.

Probably the greatest contribution of this invention to the art lies in the great flexibility in the design of an array which is provided. For example, the invention process provides the means for assembling layers of different composition in any desired order. Similarly, linkages of various kinds can be incorporated within a single array, thus permitting optimization of the inner sphere pathway for charge transport. The metal may or may not be the same throughout an array. The metal may be of one kind in a given layer and of another kind in the next layer or may be mixed within a layer. Should one wish to do so, arrays can be made having varying properties such as redox potentials and optical absorption properties. Thus the designer is given the means to "tune" the array to produce photosensitive elements having optimum properties in a large number of applications.

DESCRIPTION OF THE PREFERRED EMBODIMENTS

Critical to the proper functioning of the template is the requirement that the metal coordination compounds orient themselves on the substrate in such a way that one of the axial positions of the metal atom is oriented outwardly from the substrate. This may be accomplished by selection or, for example, by substituting the ligand with one or more hydrophobic groups and depositing the metal coordination compound derived therefrom on a substrate surface which has been rendered hydrophobic. The substituent groups, in combination with the hydrophobicity of the surface, cause the metal coordination compound to orient itself on the substrate so as to expose the metal atom to further reaction.

If the substrate is to be a part of the finished element, an electrically conductive solid such as metal foil or a semiconductor (such as certain metal oxides, e.g., tin oxide) is normally selected. If other uses of the template are contemplated, such as reuse of the template following removal of the array, (for example, by means to be described) then less expensive substrates such as glass are used. Arrays can also be assembled, sometimes for special uses, on plastics, for example, the polyimides, and polyvinylalcohol.

The substrate is rendered hydrophobic by art means such as by deposition of a monolayer of long-chain fatty acid on the surface by transfer from a water surface. The surface can also be treated with a dihalodialkylsilane, and this process is preferred. Alkoxyalkane substituted silanes are also operable.

Figure 1:
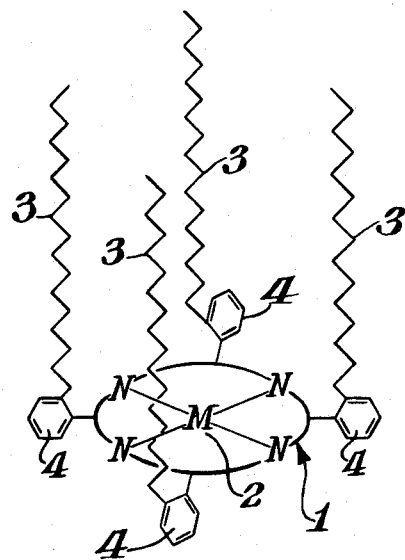
FIG. 1 is a partly schematic drawing of a substituted metalloporphyrin useful in the template layer.

The process of preparing the template and thereafter assembling an array is illustrated in figures. FIG. 1 shows a preferred metal coordination compound in which the template ligand is substituted with multiple hydrophobic groups. Part 1 represents a porphyrin ring derivative coordinating a metal cation 2 represented by "M". Stearylamido groups 3, substituents on phenyl groups 4, selected for ease of synthesis, provide hydrophobic groups. The phenyl groups 4 in turn substitute porphyrin ring 1 at the meso position.

Figure 2:
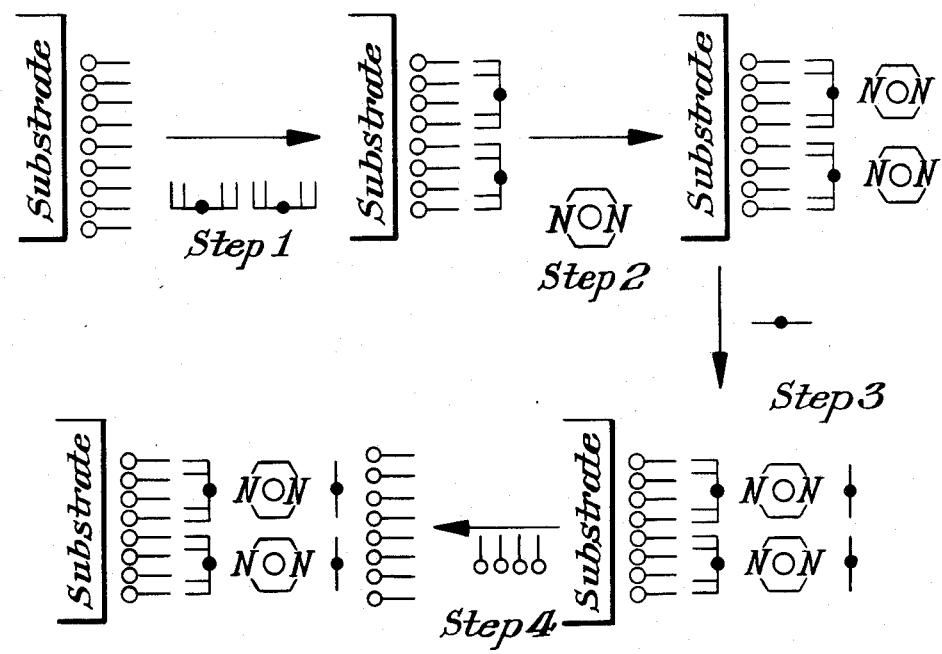
FIG. 2 is a schematic drawing illustrating four invention steps whereby a two-layer array of the invention is formed.

Illustrated as the starting material of Step 1 of FIG. 2 is a substrate rendered hydrophobic by deposition of an ordered monolayer of long chain fatty acid from a water surface. In step 1 a substituted metallophorphyrin such as that of FIG. 1 is deposited thereon as an ordered monolayer from a water surface. Not shown are about four optical stearic acid molecules for each porphyrin molecule which contribute to the orientation stability of the array. They are sometimes called photoinert spacers.

In step 2 the partial array is treated with a linking agent, in this case pyrazine, which coordinates on the exposed axis of the metal atoms. The resulting structure represents a completed template.

In step 3 a water soluble metalloporphyrin is deposited on the template to produce a two-layer array. Steps 2 and 3 can be repeated to produce the desired number of layers. For most purposes, from about 2 to about 50 layers are needed.

Step 4 is optional. The array can be withdrawn as shown from the reaction bath through a monolayer of long chain fatty acid to protect the layers already in place or the array can be removed without disturbing the layers by lifting the array out of the bath with its principal axes parallel to the surface of the bath.

Optionally, arrays can be assembled on both sides of the substrate.

Layers can be added to the template and the growing array as outlined above, by flowing solutions of the linking agent or metal coordination compounds past the submerged array. This method is preferred although simple dipping is also operable.

Figure 3:
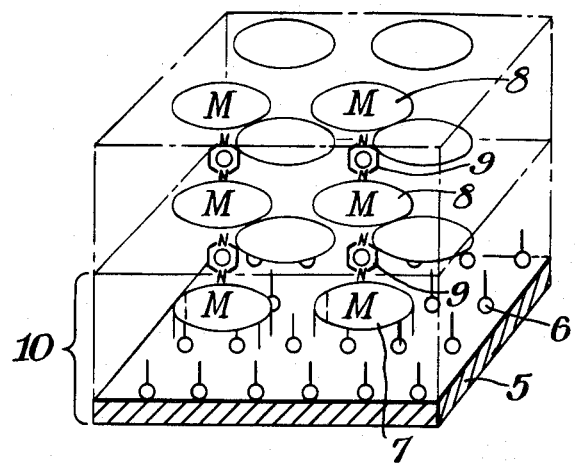
FIG. 3 is a three dimensional drawing showing schematically a finished three-layer array of the invention.

An example of a complete invention array of three layers is shown in FIG. 3. In this figure substrate 5 is rendered hydrophobic by oriented stearic acid molecules 6 deposited on the substrate as described earlier. Above this are metallotetra($\alpha,\alpha,\alpha,\alpha$-o-stearylamidophenyl)porphyrin molecules 7 so oriented as to place the substitutent groups adjacent to the hydrocarbon portions of the stearic acid molecules. Inert spacers, which may be present, are not shown. Connected to the porphyrin layer and the next higher layer are linking agent molecules 9, in this example pyrazine, the nitrogen atoms coordinating metal atoms in the two layers. Linking agent molecules 9 also connect the two layers of metalloporphyrin derivative molecules 8 in the same way. In the interest of clarity, all elements of the stack are shown only in the front row.

The choice of ligand is not critical. Those usual in the art are satisfactory such as the glyoximes, the Schiff bases such as those derived from salicylaldehyde or, as is preferred, tetraazamacrocycles such as porphyrin derivatives. It is preferred that the metal coordination compounds be largely planar so that they readily orient themselves in the manner described above. Obviously the exemplified substituted ligand of the template does not have to form a completely planar metal coordination compound.

Probably all transition metals and other metals such as magnesium and zinc are operable. Particular metals will be selected according to the end use of the array, cost and availability. Preferred metals are iron, ruthenium, cobalt, copper and zinc. Most preferred are iron, ruthenium, and cobalt.

Normally the metal is present in the cationic form. As the array is, of course, electrically neutral, anions, which may be the ligand or the linking agent, are present.

In preferred embodiments, the linking agents are selected from oxygen, sulfur, or, as is most preferred nitrogen-containing organic bifunctional electron pair donors capable of coordinating the metal atom at both functional groups. Typical of this type of linking agent are pyrazine, which is most preferred, 4,4'-bipyridyl, and 1,2-bis(4-pyridyl)ethylene.

Linking agents are not limited to neutral compounds. Charged species, such as imidazolate anion, for example, are also operable. Other anions are also operable such as the halides and pseudohalides such as thiocyanate, cyanide, and azide. Azide ion may have special utility because oxidation of an array containing at least one layer having such a linkage using nitrosonium salts such as nitrosonium tetrafluoroborate could result in cleavage at that layer for special uses, with the formation of innocuous nitrogen and nitrous oxide.

As indicated above oxygen and sulfur may form linkages. Oxygen, for example, can be attached to some template monolayers by oxidation, as is known in the art of iron porphyrins. Sulfur is probably most conveniently employed as the sulfide ion as will be apparent to the chemist.

Naturally, when charged species are employed, counter ions are necessarily also present but usually do not participate in the linking process. For example, sulfur might be introduced as a linking agent in the form of sodium sulfide.

The following examples further illustrate the invention.

EXAMPLE 1

This example illustrates the assembly of templates on glass slides.

Slides (25×75 mm) were thoroughly cleaned, as is usual in the art, first with hot organic solvents and then with nitric acid and ammonium hydroxide. Finally they were rinsed with triply distilled water and dried in a dust-free environment.

Following cleaning, the slides were rendered hydrophobic by treatment with $Si(CH_3)_2Cl_2$ (dichlorodimethylsilane) or with stearic acid.

The silane process, which is preferred, was carried out by immersing the slides for five minutes in an ultrasonically agitated bath of 15 ml of the silane in 500 ml of chloroform. After removal from the bath, the slides were rinsed, first with methanol and then with triply distilled water and dried.

Although it is within the invention to coat both sides of the substrate, coating in these experiments was restricted to one side by attaching two slides back to back.

The stearic acid monolayers were applied from an aqueous subphase, which was buffered with sodium bicarbonate to pH 6.5 and was about $3 \times 10^{-4}$ molar in $CdCl_2$. Cadmium chloride, as is known in the art, improves the orderly deposition of fatty acids on surfaces passed through airsubphase interfaces. Slides were placed vertically under the surface of the subphase and stearic acid was added. In this example, three layers were applied to provide a smooth surface. It is known that triple layers are more insulating than are monolayers and this may be important in some applications. A constant surface pressure of about 30 dynes/cm was applied to the surface layer and a motor driven lift first brought the slides up through the interface, then downwardly and again upwardly through the interface at a velocity of about 1 cm/min. The slides after treatment were clearly hydrophobic.

In separate experiments having to do with the preparation of monolayers of zinc tetra($\alpha,\alpha,\alpha,\alpha$-o-stearylamidophenyl)porphyrin on a subphase and transfer to the hydrophobic substrate, it was shown that addition of four molar proportions of stearic acid to the porphyrin stabilizes the figure-illustrated orientation, presumably by filling the space between the stearylamidophenyl groups.

A monolayer of metal coordination compound was applied by passing the slides downwardly through the above-described porphyrin-stearic acid monolayer under constant surface pressure of 25 dynes/cm at a velocity of 1 cm/min. The slide, mounted in a cell under subphase liquid, was examined by luminescence spectroscopy which demonstrated that satisfactory transfer had occurred. A Perkin-Elmer MPF-44B spectrophotometer, equipped with a DCSU-2 microprocessor, was used. Excitation and emission spectra of the slides, were measured from the back side with the exciting light incident at an angle of 30° to the normal of the slides. Comparison of the emission ($\lambda_{ex}$, 435 nm) and excitation ($\lambda_{em}$, 660 nm) spectra of the slides with those of the same $10^{-6}$ M zinc prophyrin in $CHCl_3$ solution indicated that the monolayer was pure and not aggregated. A slight broadening and slight bathochromic shift (ca. 10 nm) as was expected for closely packed chromophoric molecules of this type, was observed.

Linking agent was added to the porphyrin to provide a completed template by flowing a $10^{-3}$ M aqueous solution of 1,2-bis(4-pyridyl)ethylene over the porphyrin monolayer. This was done in a cell mounted in the above described spectrophotometer. Means were provided to flush the cell, first with distilled water to remove the subphase liquid, and then with the above linking agent solution. The 660 nm emission was observed to increase during water flushing by about 10%, due, it is believed, to removal of some cadmium ions, which have a slight quenching effect, from the stearic acid layers.

While the linking agent solution was passing through the cell, the intensity of the emission peak increases and shifted to the red. After flushing with distilled water, the intensity had increased 40% and shifted 4 nm toward the red. The shift, which was essentially unchanged on continued flushing, was consistent with reaction of the linking agent with the metal of the porphyrin, thus to form a complete template of the invention.

EXAMPLE 2

This example illustrates the assembly of a zinc porphyrin layer on a hydrophobic semiconductor as might be done in the assembly of a finished device.

The semiconductor was 3000 Å thick $SnO_2$ doped with Sb and deposited on a glass slide. The resistance of the semiconductor was 100 ohms per square and the optical transmittance was 85% above 400 nm.

The procedure was essentially the same as in Example 1 (except that ammonium hyfroxide was not employed in cleaning) and the results were similar.

EXAMPLE 3

This example illustrates the addition of a second layer of metal coordination compound to a template. The second layer contained a ligand and a metal which were different from those of the first layer.

The template of Example 1, while still mounted in the cell, was contacted with a $10^{-5}$ M aqueous solution of copper meso-tetra(4-N-methylpyridyl)-porphyrin tetraiodide. The 660 nm emission of the zinc porphyrin of the template was observed to be immediately and totally quenched and it remained so on rinsing with distilled water.

As it is known that copper is a strong fluorescence quencher, the results of this experiment are regarded as highly consistent with a strong interaction of the copper porphyrin with the zinc porphyrin of the template via the interlayer linkage.

EXAMPLE 4

A template analogous to that of Example 1, in which the linking agent was pyrazine, was treated with a solution of zinc meso-tetra(4-N-methylpyridyl)porphyrin tetraiodide. The 435 nm Soret absorption of the array was observed, by visible absorption spectroscopy, to shift 5 nm toward the red. No such shift occurred when the linking agent was absent. It is concluded that an invention array comprising two metal coordination compounds layers was formed.

EXAMPLE 5

This example was not actually carried out using a complete array. The below-described template, minus the linking agent, however, was assembled and found to develop, on illumination with a General Electric ELH projection lamp having an integrated irradiance of about 75 mW $cm^{-2}$, 15 mv open circuit voltage and a short circuit current of $1.5 \times 10^{-6}$A $cm^{-2}$.

The template would be assembled from layers comprising, in order, a glass supported silanized $SnO_2$ semiconductor and thereon a layer of stearic acid-zinc meso-tetra($\alpha,\alpha,\alpha,\alpha$-o-stearylamidophenyl)porphyrin(4:1 mol.) and pyrazine linking agent. Thereon would be assembled about 30 layers of water soluble ruthenium porphyrin interspersed with pyrazine interlayer linkages.

The $SnO_2$ semiconductor is electrically connected to a wire lead by means of conductive cement and is mounted, with the coating on the inside, to cover tightly a polytetrafluoroethylene cup having an inside platinum electrode. The cup is filled with an electrolyte consisting of 0.1 M $Na_2SO_4$, buffered to pH 7 with phosphate buffer, and a redox agent such as 0.01 M hydroquinone or ascorbate. On similar illumination through the glass support, the element is expected to develop an open circuit voltage about the same and a short circuit current about 30 times that of the above template minus the linking agent.

That which is claimed is:

1. The process of assembling an array having utility in photosensitive elements comprising contacting a first monolayer of a metal coordination compound, said first monolayer characterized by a linking agent attached to the metal atom of the compound, with a water solution of a second metal coordination compound thereby causing the assembly of a second metal monolayer on said first monolayer, said linking agent forming thereby an interlayer linkage between metal atoms of the first monolayer and the second monolayer whereby to cause said layers to assume an interlayer orientation wherein the metal atoms are a stacked one above the other.

2. The process of claim 1 wherein the metal coordination compounds of the first and second monolayers comprise metal atoms selected from the group consisting of transition metals, magnesium, and zinc.

3. The process of claim 2 wherein the metal atoms are selected from the group consisting of iron, ruthenium, cobalt, and copper.

4. The process of claim 2 wherein the metal atoms of the metal coordination compounds of the first and second monolayers is zinc.

5. The process of claim 1 wherein the metal coordination compounds of the first and second monolayers comprise ligands selected from the group consisting of glyoximes, Schiff bases, and tetraazamacrocycles.

6. The process of claim 1 wherein the first and second metal coordination compounds comprise ligands selected from the group consisting of porphyrin derivatives.

7. The process of claim 6 wherein the first metal coordination compound is meso-tetra($\alpha,\alpha,\alpha,\alpha$-O-stearylamidophenyl)porphyrin and the second monolayer metal coordination compound is tetraphenylporphyrin.

8. The process of claim 1 wherein the first monolayer and the linking agent are comprised in a template.

9. The process of claim 1 wherein the water solution is caused to flow over the submerged first layer.

* * * * *